US011411565B2

(12) United States Patent
Singh et al.

(10) Patent No.: US 11,411,565 B2
(45) Date of Patent: Aug. 9, 2022

(54) CLOCK AND DATA RECOVERY CIRCUIT

(71) Applicant: STMicroelectronics International N.V., Geneva (CH)

(72) Inventors: Rupesh Singh, Ghaziabad (IN); Ankur Bal, Greater Noida (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 17/131,917

(22) Filed: Dec. 23, 2020

(65) Prior Publication Data

US 2021/0211133 A1 Jul. 8, 2021

Related U.S. Application Data

(60) Provisional application No. 62/957,376, filed on Jan. 6, 2020.

(51) Int. Cl.
*H03L 7/08* (2006.01)
*G06F 1/04* (2006.01)
*H03L 7/091* (2006.01)

(52) U.S. Cl.
CPC .............. *H03L 7/0807* (2013.01); *G06F 1/04* (2013.01); *H03L 7/091* (2013.01)

(58) Field of Classification Search
CPC ..... G03F 1/04; G03F 1/06; G03F 1/08; G03F 1/10; G03F 1/105; G03F 1/12; G03F 1/14; H03L 7/0807; H03L 7/085; H03L 7/091; H04L 7/0008; H04L 7/0012; H04L 7/033; H04L 7/0331; H04L 7/0334; H04L 7/0337; H04L 7/0338
See application file for complete search history.

(56) References Cited

U.S. PATENT DOCUMENTS

| 5,742,188 A | 4/1998 | Jiang et al. |
| 6,097,766 A | 8/2000 | Okubo et al. |
| 6,252,464 B1 | 6/2001 | Richards et al. |
| 6,335,766 B1 | 1/2002 | Twitchell et al. |

(Continued)

FOREIGN PATENT DOCUMENTS

EP 1126653 A2 8/2001

OTHER PUBLICATIONS

J. Kim, et al., "A study of the referenceless CDR based on PLL," 2016 International SoC Design Conference (ISOCC).

(Continued)

*Primary Examiner* — Diana J. Cheng
(74) *Attorney, Agent, or Firm* — Crowe & Dunlevy

(57) ABSTRACT

A first sampling circuit takes phase offset first samples of a received serial data stream in response to a first edge of a sampling clock and a first comparator circuit determines whether the plurality of phase offset first samples have a same logic state. A second sampling circuit takes phase offset second samples of the received serial data stream in response to a second edge of the sampling clock, opposite the first edge, and a second comparator circuit determines whether the phase offset second samples have a same logic state. One of the first samples or one of the second samples is then selected in response to the determinations made by the first and second comparator circuits. A serial to parallel converter circuit generates an output word including the selected one of the first and second samples.

25 Claims, 5 Drawing Sheets

(56) References Cited

U.S. PATENT DOCUMENTS

| | | | |
|---|---|---|---|
| 6,415,004 | B1 | 7/2002 | Fujimura et al. |
| 7,095,803 | B2 | 8/2006 | Gazsi et al. |
| 7,254,185 | B2 | 8/2007 | Chiu et al. |
| 7,672,406 | B2 * | 3/2010 | Takeuchi ............ H03M 9/00 375/345 |
| 7,844,021 | B2 | 11/2010 | Gibbons et al. |
| 8,774,336 | B2 | 7/2014 | Bae et al. |
| 9,832,008 | B2 | 11/2017 | Chowdhary et al. |
| 10,347,283 | B2 * | 7/2019 | Hormati ............ H04L 7/0025 |
| 2005/0135518 | A1 | 6/2005 | Vallet et al. |

OTHER PUBLICATIONS

Jou S J et al: "Design and Analysis of Digital Data Recovery Circuits Using Oversampling" vol. 1 No. 1, Feb. 15, 2007, pp. 93-101.

EPO Search Report and Written Opinion for co-pending EP Appl. No. 21150040.0 dated May 28, 2021 (10 pages).

\* cited by examiner

CLOCK AND DATA RECOVERY CIRCUIT

CROSS-REFERENCE TO RELATED APPLICATION

This application claims priority from U.S. Provisional Application for Patent No. 62/957,376, filed Jan. 6, 2020, the disclosure of which is incorporated by reference.

TECHNICAL FIELD

The present invention generally relates to a clock and data recovery circuit.

BACKGROUND

A clock serial link receiver must operate to recover both the serially transmitted data and the clock without the assistance of an additional clock input provided by the serial link transmitter. A clock and data recovery (CDR) circuit is typically used. There are many known CDR circuits. These circuits suffer from at least the following concerns: the need to utilize a dedicated phase lock loop (PLL) circuit, a high complexity to implement oversampling, the presence of a feedback loop which introduces a bandwidth limitation, circuitry which occupies a large area and/or consumes a significant amount of power, and a lengthy time to achieve lock for the recovered clock.

There is a need in the art to develop a CDR circuit which addresses the foregoing concerns.

SUMMARY

In an embodiment, a circuit comprises: a first sampling circuit configured to take a plurality of phase offset first samples of a received serial data stream in response to a first edge of a sampling clock; a second sampling circuit configured to take a plurality of phase offset second samples of the received serial data stream in response to a second edge of the sampling clock, wherein the second edge is opposite the first edge; a first comparator circuit configured to determine whether the plurality of phase offset first samples have a same logic state; a second comparator circuit configured to determine whether the plurality of phase offset second samples have a same logic state; a first selection circuit configured to select one of the first samples or one of the second samples in response to the determinations made by the first and second comparator circuits; and a serial to parallel converter circuit configured to generate an output word including the selected one of the first and second samples.

In an embodiment, a method comprises: sampling a received serial data stream in response to a first edge of a sampling clock to obtain a plurality of phase offset first samples; sampling the received serial data stream in response to a second edge of the sampling clock, wherein the second edge is opposite the first edge, to obtain a plurality of phase offset second samples; determining whether the plurality of phase offset first samples have a same logic state; determining whether the plurality of phase offset second samples have a same logic state; first selecting one of the first samples or one of the second samples in response to results of the determining steps; and including the selected one of the first and second samples for a serial to parallel conversion to generate an output word.

BRIEF DESCRIPTION OF THE DRAWINGS

For a better understanding of the embodiments, reference will now be made by way of example only to the accompanying figures in which.

DETAILED DESCRIPTION

Figure 1A:
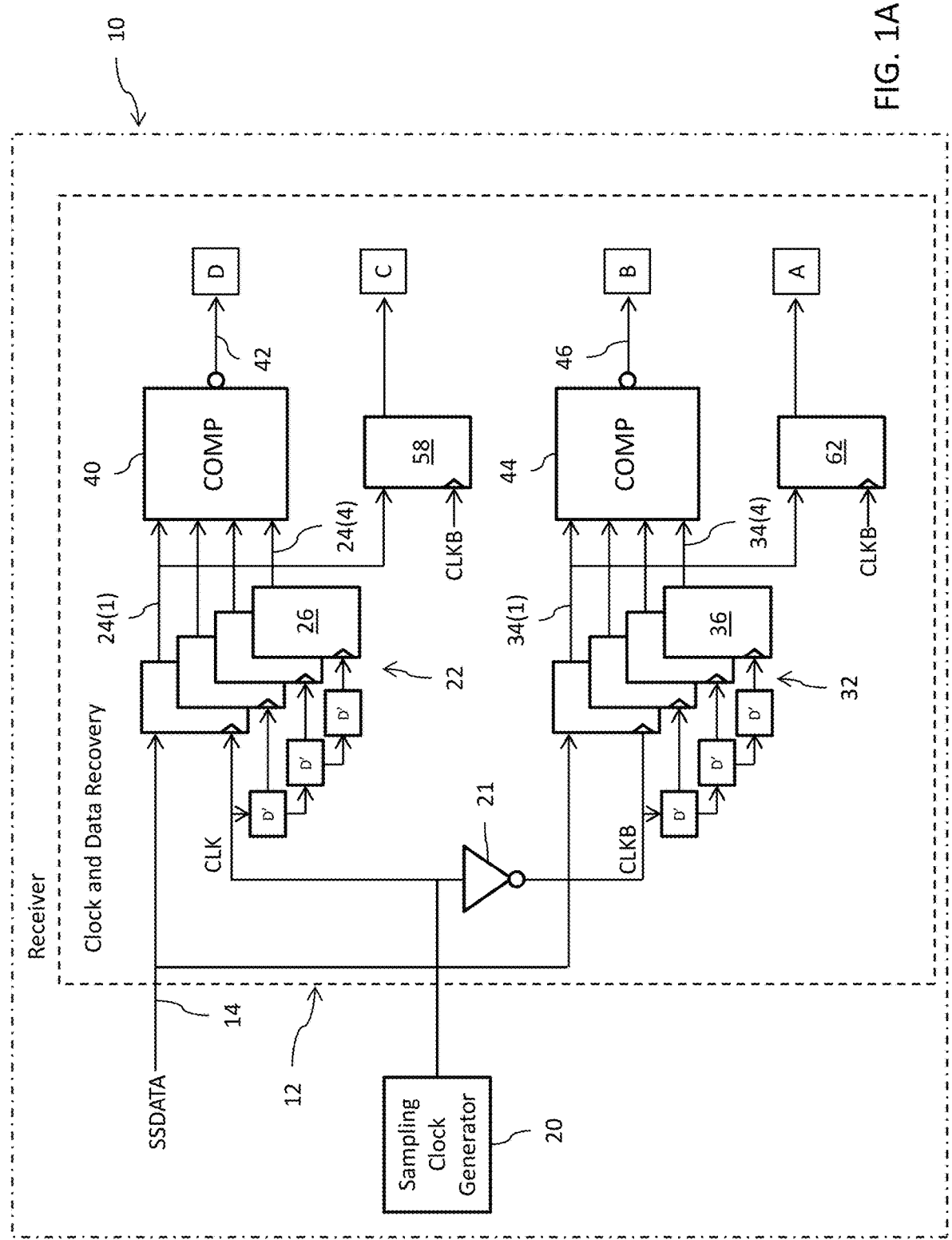
FIGS. 1A-1C present a block diagram of a clock and data recovery (CDR) circuit.
Figure 1B:
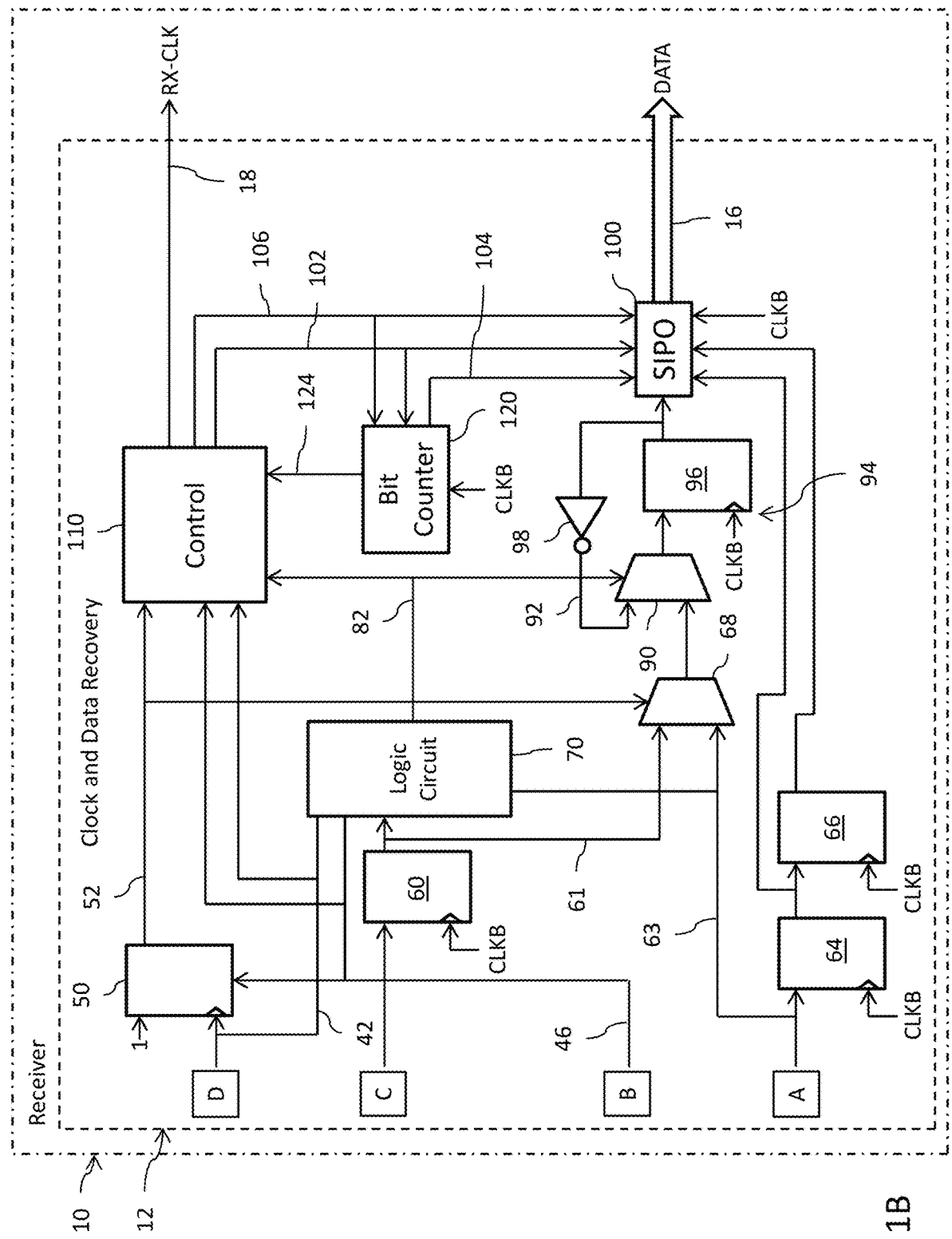
Figure 1C:
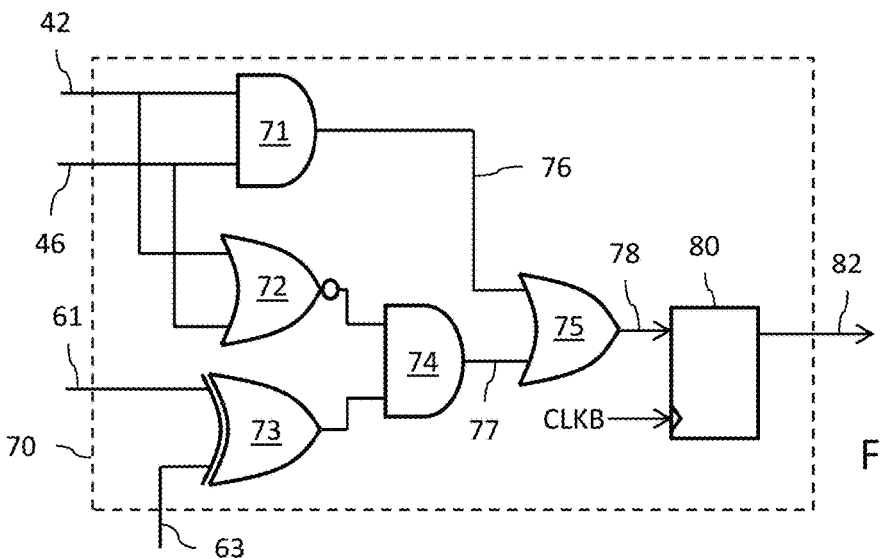

Reference is now made to FIGS. 1A-1C which show a block diagram of a clock and data recovery (CDR) circuit 10 within a receiver circuit 12. An input 14 receives a serial bit stream (SSDATA) generated by a transmit circuit (not shown). The transitions between the high and low logic states in the serial bit stream, which represent the data being transmitted by the transmit circuit, are timed in phase with a transmit clock signal generated by the transmit circuit. However, that transmit clock signal is not itself transmitted to the receiver circuit 12. This makes it difficult for the receiver circuit 12 to accurately extract the data from the serial bit stream. The CDR circuit 10 operates to extract the data 16 (DATA) from the serial bit stream and generate a clock signal (RX-CLK) 18 corresponding to the transmit circuit clock signal based on transitions of logic state of the received serial bit stream SSDATA. The CDR circuit 10 processes the received serial bit stream SSDATA including bits b0-bx (x indicating the index of the bits in the stream) to recover the transmit clock signal 18 and extract the bits for output as DATA 16 for use by the receiver circuit 12.

A clock generator 20 of the receiver circuit 12 generates a sampling clock CLK and an inverter circuit 21 generates the logical inverse of the sampling clock (referred to as the inverse sampling clock CLKB). The frequency of the sampling clock is at least twice the data rate of the serial bit stream SSDATA.

Figure 2:
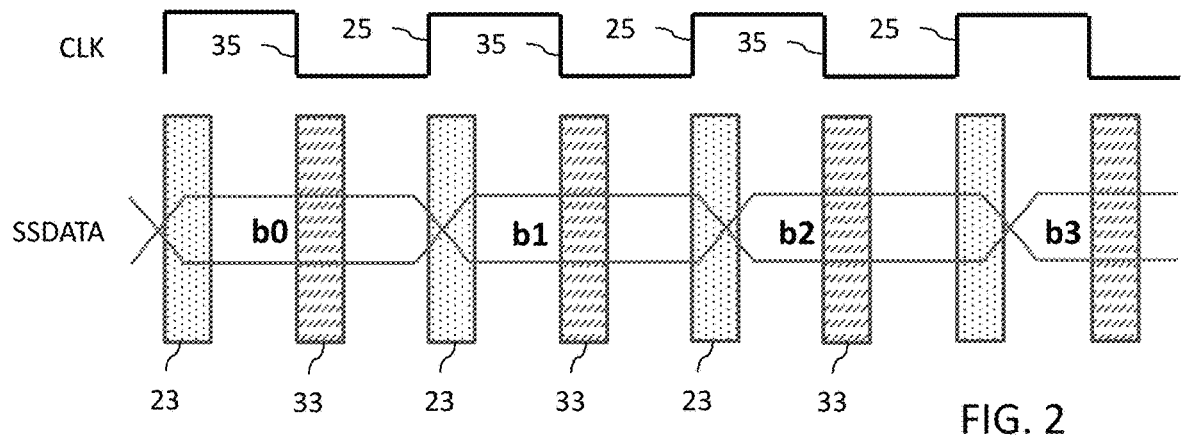
FIG. 2 is a timing diagram showing a sampling operation.

A first sampling circuit 22 operates in response to the sampling clock CLK to take a first plurality of phase-shifted samples 24(1)-24(4) of the received serial bit stream SSDATA during a first sampling window (reference 23 in FIG. 2). The first sampling circuit 22 is actuated to take the samples 24 within the sampling window 23 in response to the rising edge (reference 25 in FIG. 2) of the sampling clock CLK. These rising edge samples 24 are latched by a corresponding plurality of flip-flops 26 whose data inputs all receive the serial bit stream SSDATA and whose clock inputs receive phase-shifted sampling clock CLK signals which define the length of the first sampling window 23. The phase-shifted sampling clock CLK signals are generated by serially-connected delay circuits D' in response to the sampling clock CLK.

A second sampling circuit 32 operates in response to the inverse sampling clock CLKB to take a second plurality of phase-shifted samples 34(1)-34(4) of the received serial bit stream SSDATA during a second sampling window (reference 33 in FIG. 2). The second sampling circuit 32 is actuated to take the samples 34 within the sampling window 33 in response to the rising edge of the inverse sampling clock CLKB (i.e., in response to the falling edge (reference 35 in FIG. 2) of the sampling clock CLK). These falling edge samples 34 are latched by a corresponding plurality of flip-flops 36 whose data inputs all receive the serial bit stream SSDATA and whose clock inputs receive phase-shifted inverse sampling clock CLKB signals which define the length of the second sampling window 33. The phase-shifted inverse sampling clock CLKB signals are generated by serially-connected delay circuits D' in response to the inverse sampling clock CLKB.

A first comparator circuit 40 receives the plurality of rising edge samples 24(1)-24(4) from the first sampling window 23 as generated by the first sampling circuit 22 and performs a comparison of the logic state of the samples 24. If all samples 24 within the first sampling window 23 have the same logic state, the first comparator circuit 40 asserts a first comparison output signal 42 to a logic "0" state. Conversely, if there is a detected change in logic state of the rising edge samples 24 within the sampling window 23, the first comparison output signal 42 is set to logic "1".

A second comparator circuit 44 receives the plurality of falling edge samples 34(1)-34(4) from the second sampling window 33 as generated by the second sampling circuit 32 and performs a comparison of the logic state of the samples 34. If all samples 34 within the second sampling window 33 have the same logic state, the second comparator circuit 44 asserts a second comparison output signal 46 to logic "0". Conversely, if there is a change in logic state of the samples 34 within the sampling window 33, the second comparison output signal 46 is set to logic "1".

A latch circuit 50 (formed by a D-type flip-flop) includes a data input configured to receive a logic "1" signal, a clock input configured to receive the first comparison output signal 42 and a reset input configured to receive the second comparison output signal 46. The latch circuit 50 responds to a rising edge of the first comparison output signal 42 (caused by the comparison of the samples 24 within the first sampling window 23 finding that the samples 24 do not all have the same logic state) by latching the logic "1" signal and a data select signal 52 is output with a logic "1" state. The latch circuit 50 responds to the rising edge of the second comparison output signal 46 (caused by the comparison of the samples 34 within the second sampling window 33 finding that the samples 34 do not all have the same logic state) by resetting the latch so as to output the data select signal 52 with a logic "0" state.

The logic state of the data select signal 52 identifies which one of the first sampling circuit 22 or second sampling circuit 32 has captured a correct value of the received serial bit stream SSDATA. In this regard, if the data select signal 52 is logic "1", then this indicates that the first comparison output signal 42 is logic "1" and a data transition occurred during the first sampling window 23. For this case, the second sampling circuit 32 has likely captured the correct value of the received serial bit stream SSDATA during the second sampling window 33 with falling edge sample 34. Conversely, if the data select signal 52 is logic "0", then this indicates that the second comparison output signal 46 is logic "1" and a data transition occurred during the second sampling window 33. For this case, the first sampling circuit 22 has likely captured the correct value of the received serial bit stream SSDATA during the first sampling window 23 with rising edge sample 24.

A latch circuit 58 (formed by a flip-flop) includes a data input configured to receive one of the plurality of rising edge samples 24(1)-24(4) and a clock input configured to receive the inverse sampling clock CLKB. In the illustrated implementation, the first sample 24(1) is received, but it will be understood that any of the samples 24 could be used. Because the flip-flop 58 latches in response to the rising edge of the inverse sampling clock CLKB, the flip-flop is active in the half-phase of the clock CLK after the samples are taken by the sampling circuit 22 (i.e., when the sampling circuit 32 is operating to sample). The output from the latch circuit 58 is a signal which is a captured current rising edge sample of the serial bit stream SSDATA from the current first sampling window 23. This captured current sample is considered to likely have the correct value of the received serial bit stream SSDATA if the data select signal 52 is logic "0" (due to the comparator 44 detecting a logic transition in the second sampling window 33).

An additional latch circuit 60 (formed by a flip-flop) is coupled in series with the latch circuit 58 and clocked by the inverse sampling clock CLKB. The output of latch 58 is coupled to the data input of latch circuit 60. The latch circuits 58, 60 form a serial shift register that is clocked by the inverse sampling clock CLKB and configured to store two consecutive rising edge first samples 24(1) (i.e., samples taken during the current and previous first sampling windows). This implementation with latch circuits 58, 60 is needed to match latency with parallel processing of the sampled received serial bit stream SSDATA.

A latch circuit 62 (formed by a flip-flop) includes a data input configured to receive one of the plurality of falling edge samples 34(1)-34(4) and a clock input configured to receive the inverse sampling clock CLKB. In the illustrated implementation, the first sample 34(1) is received, but it will be understood that any of the samples 34 could be used. The flip-flop 62 latches in response to the rising edge of the inverse sampling clock CLKB (i.e., when the sampling circuit 32 is operating to sample). The output from the latch circuit 62 is a signal which is a captured current sample of the serial bit stream SSDATA from the current second sampling window 33. This captured current sample is considered to likely have the correct value of the received serial bit stream SSDATA if the data select signal 52 is logic "1" (due to the comparator 40 detecting a logic transition in the first sampling window 23).

Two additional latch circuits 64 and 66 (each formed by a flip-flop) are coupled in series with the latch circuit 62. The output of latch 62 is coupled to the data input of latch circuit 64 and the output of latch circuit 64 is coupled to the input of latch circuit 66. The latch circuits 62, 64 and 66 form a serial shift register that is clocked by the inverse sampling clock CLKB and configured to store three consecutive falling edge first samples 34(1) (i.e., samples taken during the current and previous two second sampling windows). This implementation with latch circuits 62, 64, 66 is needed to match latency with parallel processing of the sampled received serial bit stream SSDATA.

It will be noted that the shift register for storing first samples 24(1) stores only two data samples while the shift register for storing first samples 34(1) stores three data samples. This difference in size of the shift registers is necessary because data processing in the circuit 10 is occurring in response to the falling edge of the sampling clock CLK. The rising edge driven flip-flops 58 and 60 store two rising edge samples of the serial bit stream SSDATA and the falling edge driven flip-flops 62, 64 and 66 store three falling edge samples of the serial bit stream SSDATA, where the two rising edge samples are interleaved between the three falling edge samples.

The preceding rising edge captured sample 61 of the serial bit stream SSDATA output from the latch circuit 60 for the first sampling window 23 is applied to a first input of a first multiplexer circuit 68. A second input of the first multiplexer circuit 68 receives the current falling edge captured sample 63 of the serial bit stream SSDATA output from the latch circuit 62 for the second sampling window 33. The select (control) input of the first multiplexer circuit 68 is coupled to receive the data select signal 52 output from the latch circuit 50, and the multiplexer circuit 68 functions to selectively pass the sample 61 or 63 taken from the window 23 or 33, respectively, which does not contain a detected logic transition.

When the data select signal 52 is logic "1", which occurs in response to the first comparison output signal 42 indicating comparator 40 detection of a transition in logic state of the plurality of rising edge samples 24(1)-24(4) within the first sampling window 23, the first multiplexer circuit 68 is controlled to select the current captured falling edge sample 34(1) of the serial bit stream SSDATA as output 63 from the latch circuit 62 for the second sampling window 33 as a likely correct data sample. Conversely, when the data select signal 52 is logic "0", which occurs in response to the second comparison output signal 46 indicating comparator 44 detection of a transition in logic state of the plurality of falling edge samples 34(1)-34(4) within the second sampling window 33, the first multiplexer circuit 68 is controlled to select the previous captured rising edge sample 24(1) of the serial bit stream SSDATA from the first sampling window 23 as output 61 from the latch circuit 60 as a likely correct data sample.

A combinational logic circuit 70 receives: the first comparison output signal 42, the second comparison output signal 46, the preceding rising edge sample 61 of the serial bit stream SSDATA as output from the latch circuit 60, and the current falling edge sample 63 of the serial bit stream SSDATA as output from the latch circuit 62. The combinational logic circuit 70 includes a logical AND gate 71 having a first input receiving the first comparison output signal 42 and a second input receiving the second comparison output signal 46. A first signal 76 output from the logical AND gate 71 is logic "1" only if the first comparison output signal 42 and the second comparison output signal 46 are both logic "1". This occurs only when the first comparator circuit 40 determines that the samples 24 within the first sampling window have different logic states and the second comparator circuit 40 determines that the samples 34 within the second sampling window also have different logic states. The logic "1" output of the AND gate 71 accordingly indicates detection of the operating scenario 3) referenced below where the serial data SSDATA changes state during both the first sampling window 23 and the second sampling window 33.

A logical NOR gate 72 has a first input receiving the first comparison output signal 42 and a second input receiving the second comparison output signal 46. The output of the logical NOR gate 72 is logic "1" only if the first comparison output signal 42 and the second comparison output signal 46 are both logic "0". This occurs only when the first comparator circuit 40 determines that all rising edge samples 24 within the first sampling window have a same logic state and the second comparator circuit 40 determines that all falling edge samples 34 within the second sampling window have a same logic state. The logic "1" output of the NOR gate 72 accordingly indicates detection of the operating condition where there is no change of serial data SSDATA state during both the first sampling window 23 and the second sampling window 33.

The combinational logic circuit 70 further includes a logical exclusive-OR gate 73 having a first input receiving the preceding captured rising edge sample 61 of the serial bit stream SSDATA as output from the latch circuit 60 for the first sampling window 23 and a second input receiving the current captured falling edge sample 63 of the serial bit stream SSDATA as output from the latch circuit 62 for the second sampling window 33. The output of the logical exclusive-OR gate 73 is logic "1" when the previous captured sample from the first sampling window and the current captured sample during the second sampling window have different logic states. Otherwise, the output of the logical exclusive-OR gate 73 is logic "0". The logic "1" output of the XOR gate 73 accordingly indicates detection of the operating condition where the samples 24(1) and 34(1) have different logic states.

A logical AND gate 74 within the combinational logic circuit 70 receives the outputs of the logical NOR gate 72 and logical exclusive-OR gate 73 to generate a second signal 77. The second signal 77 is logic "1" only if output of the logical NOR gate 72 is logic "1" and the output of the logical exclusive-OR gate 73 is logic "1". Otherwise, the output of the logical AND gate 74 is logic "0". The logic "1" output of the AND gate 74 accordingly indicates detection of the operating scenario 2) referenced below where the serial data SSDATA does not change state in either the first sampling window 23 or the second sampling window 33 (as detected by NOR gate 72) and the logic state of the samples is different in each window (as detected by XOR gate 73).

The combinational logic circuit 70 further includes a logical OR gate 75 having a first input receiving the first signal 76 and a second input receiving the second signal 77. The output of the logical OR gate 75 is a flag signal 78. The flag signal 78 output by the logical OR gate 75 is logic "1" only if one of the first signal 76 or second signal 77 is logic "1". Otherwise, the output of the logical OR gate 75 is logic "0". Thus, the flag signal 78 is logic "1" whenever the operating scenario 2) or the operating scenario 3) has been detected.

The flag signal 78 is latched by a latch circuit 80 (formed by a flip-flop) that includes a data input configured to receive the flag signal 78 and a clock input configured to receive the inverse clock signal CLKB. The latch circuit 80 outputs a latched flag signal 82. The latched flag signal 82 has a logic state which follows the flag signal 78. To be clear, the latched flag signal 82 is logic "1" in two conditions. A first condition is when the first comparison output signal 42 and the second comparison output signal 46 are both logic "0" and the preceding rising edge sample 61 of the serial bit stream SSDATA as output from the latch circuit 60 and the current falling edge sample 63 of the serial bit stream SSDATA as output from the latch circuit 62 have opposite logic states. The logic "1" value of the latched flag signal 82 in this case is accordingly indicative of detection of the operating scenario 2) referenced below where the serial data SSDATA does not change state in either the first sampling window 23 or the second sampling window 33, but the logic state of the samples is different in each window. The latched flag signal 82 is also logic "1" in a second condition when the first comparison output signal 42 and the second comparison output signal 46 are both logic "1". The logic "1" value of the latched flag signal 82 in this case is accordingly indicative of detection of the operating scenario 3) referenced below where the serial data SSDATA changes state during both the first sampling window 23 and the second sampling window 33.

The selected captured sample of the serial bit stream SSDATA output from multiplexer 68 is received at a first input of a second multiplexer circuit 90. A second input of the second multiplexer circuit 90 receives a feedback signal 92 that is generated by a latching inverter circuit 94. Circuit 94 includes a latch circuit 96 (formed by a flip-flop) that includes a data input configured to receive the output of the second multiplexer circuit 90. The latch circuit 96 is clocked by the inverse sampling clock CLKB. An output of the latch circuit 96 is passed through a logical inverter 98 to generate the feedback signal 92. It will accordingly be understood that the feedback signal 92 is a logical inversion of the immediately preceding output of the second multiplexer circuit 90 as stored by latch circuit 96.

The logic state of the latched flag signal 82 controls whether the second multiplexer circuit 90 operates to pass the selected sample of the serial bit stream SSDATA output from multiplexer 68 or instead pass the feedback signal 92 (which is the logical inversion of the immediately preceding output of the second multiplexer circuit 90 as stored by latch circuit 96). The signal passed by the second multiplexer circuit 90 in response to the latched flag signal 82 is then latched by latch circuit 96 at the rising edge of the inverse sampling clock CLKB and output as a correctly detected bit of the serial stream SSDATA during one cycle of the clock CLK. The logic "1" value of the latched flag signal 82 is indicative of the situation where the current data sample may not be correct, but where the correct logic state must be the opposite logic state of the previous data sample. The opposite logic state value is provided by the latching inverter circuit 94 and passed through the multiplexer circuit 90 in response to assertion logic high of the latched flag signal 82. Otherwise, the logic "0" value of the latched flag signal 82 is indicative of the situation where the current data sample from multiplexer 68 is correct.

A serial input parallel output (SIPO) circuit 100 receives the previous two captured falling edge samples of the first sample 34(1) taken during the previous two second sampling windows as output from the latch circuits 64, 66 of the serial shift register and the detected bit provided by the signal passed by the second multiplexer circuit 90 in response to the latched flag signal 82. From these signals, the SIPO circuit 100 performs a serial to parallel conversion in response to the inverse sampling clock CLKB to output an N bit data word as the DATA 16 recovered from the serial bit stream SSDATA over a multi-bit data bus for further processing by the receiver circuit 10. The SIPO circuit 100 is clocked by the inverse sampling clock CLKB. The N bit data word for the output DATA 16 is generated by the SIPO circuit 100 from the last N received bit values output from the latches 96, 64 and 66 (where the data from latches 64 and 66 is selectively used in constructing the N bit data word as needed to address concerns with accumulated jitter).

Figure 4A:
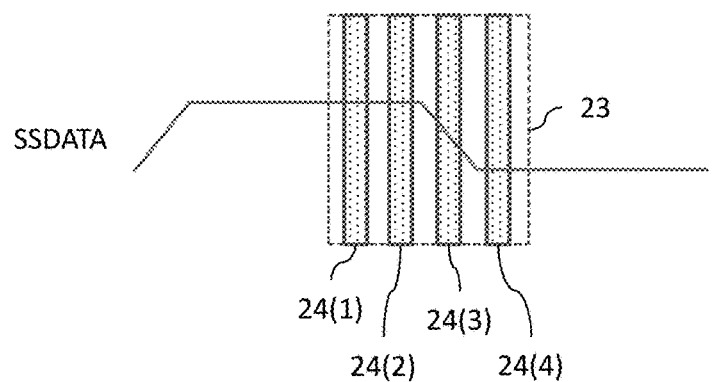
FIGS. 4A-4D illustrate operating scenarios for the CDR circuit.
Figure 4B:
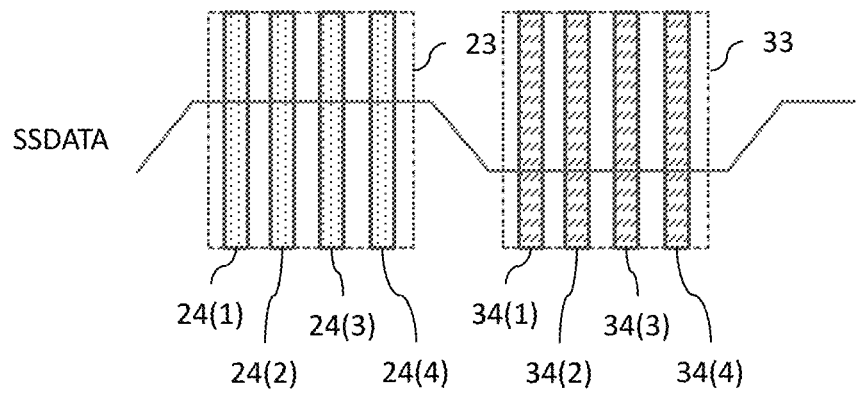
Figure 4C:
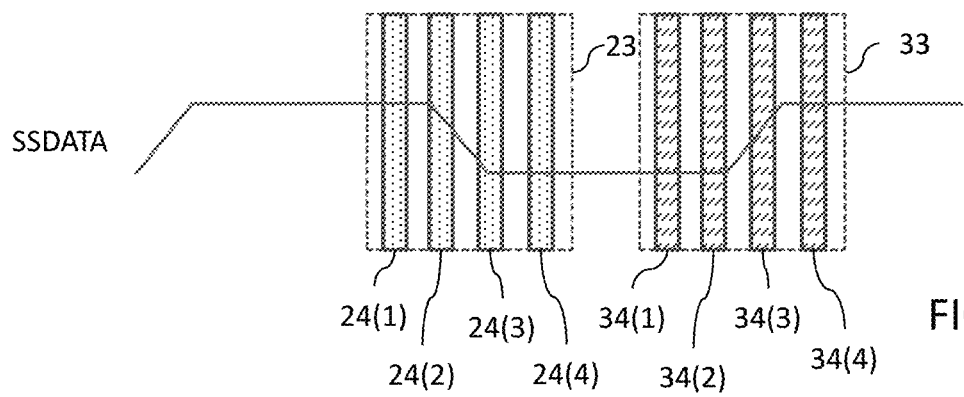
Figure 4D:
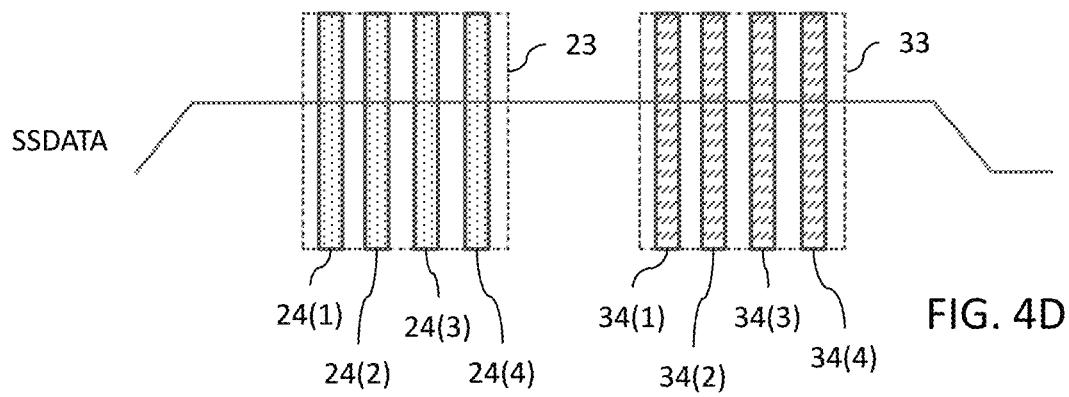

The CDR circuit 10 operates to identify the following scenarios:

1) the serial data SSDATA changes logic state during sampling window 23 and is stable during sampling window 33 (FIG. 4A, window 23 is shown and window 33 is not shown), or vice versa;

2) the serial data SSDATA does not change state in either the first sampling window 23 or the second sampling window 33, but the logic state of the samples is different in each window (FIG. 4B);

3) the serial data SSDATA changes state during both the first sampling window 23 and the second sampling window 33 (FIG. 4C); and 4) the serial data SSDATA does not change state during either the first sampling window 23 or the second sampling window 33, and the logic state of the samples is the same in both windows (FIG. 4D).

With respect to scenario 1), this is detected using the first and second sampling circuits 22, 32 and the first and second comparator circuits 40, 44. If the samples 24, 34 do not all have the same logic value, then there was a logic state change during the sampling window. In this scenario, one of the signals 42 or 62 will be logic "1" and the other of the signals 42 or 62 will be logic "0". In response to this condition, the control signal 52 causes the multiplexer 68 to select the latched sample 24 or 34 taken from the sampling window where no change in logic state was detected, and logic circuit 70 will deassert the latched flag signal 82 at logic "0". In response, the multiplexer 90 will pass the selected correct sample to be latched by circuit 96 and supplied as the detected bit to the SIPO circuit 100 for use in generating one bit of the N bit data word for output DATA 16.

The scenario 1) case is illustrated in FIG. 4A with sampling window 23 and the plurality of samples 24(1)-24(4), where sampling window 33 is not explicitly shown, but it will be understood that the samples 34 in window 33 all have the same logic state. The signal 42 will be logic "1" (due to detection of the change of logic state for SSDATA in window 23) and the signal 46 will be logic "0" (due to detection of no change of logic state for SSDATA in window 33). The sample 24(1) will be logic "1" and the sample 34(1) will be logic "0". In response to the transition of signal 42 to logic "1", the latch 50 is set and the data select signal 52 will be logic "1". As a result, the first multiplexer 68 will select to pass the sample 34(1) at logic "0" as the correct value to the second multiplexer 90. The logic circuit 70 will output a logic "0" for signal 78 which is latched by latch 80. The second multiplexer 90 is then controlled to pass the correct sample 34(1) at logic "0" to the SIPO circuit 100 for use as one bit of the N bit word for the output DATA 16.

With respect to scenario 2), this is detected using the first and second sampling circuits 22, 32 and the first and second comparator circuits 40, 44. If all the samples 24 have the same first value, all the samples 34 have the same second value, and the first and second values are different, then there was a logic state change between sampling windows. In this scenario, both of the signals 42 and 46 will be logic low and the samples 61 and 63 will have opposite logic states. The logic state of the control signal 52 in this scenario is not relevant because selection by the multiplexer 68 will be trumped by the selection made by the multiplexer 90 in response to the latched flag signal 82. The logic circuit 70 will assert the latched flag signal 82 at logic "1" because signal 77 from AND gate 74 is logic "1". In response, the multiplexer 90 will operate to pass the logical inversion of the immediately preceding output of the second multiplexer circuit 90 as stored by latch circuit 96, with the inverted data latched by circuit 96 and supplied to the SIPO circuit 100 as the detected bit for use in generating one bit of the output DATA 16.

The scenario 2) case is illustrated in FIG. 4B with sampling window 23 and the plurality of samples 24(1)-24(4) and sampling window 33 and the plurality of samples 34(1)-34(4). The signal 42 will be logic "0" (due to detection of no change of logic state for SSDATA in window 23) and the signal 46 will be logic "0" (due to detection of no change of logic state for SSDATA in window 33). The sample 24(1) will be logic "1" and the sample 34(1) will be logic "0". Because there is no transition of signal 42 or signal 46 to logic "1", the latch 50 remains in the set or reset state it was previously in. In any event, this is a "don't care" scenario with respect signal 52 and the operation of multiplexer 68. What is known in this case is that whichever of the samples that could be selected by the first multiplexer 68, the logic state of that sample may be incorrect, but the correct value for the sample is going to be the logical inverse of the previous value of the sample stored by the latch 96. The logic circuit 70 will output a logic "1" for signal 78 which is latched by latch 80. The second multiplexer 90 is then controlled to pass the logical inverse of the previous stored value through to latch 96 for output to the SIPO 100 for use as one bit of the N bit word for the output DATA 16.

With respect to scenario 3), this is detected using the first and second sampling circuits 22, 32 and the first and second comparator circuits 40, 44. If the samples 24 do not have the same first value, and the samples 34 do not have the same second value, then there was a logic state change in each sampling window and signals 42 and 46 will both be logic "1". The logic state of the control signal 52 in this scenario is not relevant because selection by the multiplexer 68 will be trumped by the selection made by the multiplexer 90 in response to the latched flag signal 82. The logic circuit 70 will assert the latched flag signal 82 at logic "1" because signal 76 from AND gate 71 is logic "1". In response, the multiplexer 90 will operate to pass the logical inversion of the immediately preceding output of the second multiplexer circuit 90 as stored by latch circuit 96, with the inverted data latched by circuit 96 and supplied to the SIPO circuit 100 as the detected bit for use in generating one bit of the output DATA 16.

The scenario 3) case is illustrated in FIG. 4C with sampling window 23 and the plurality of samples 24(1)-24(4) and sampling window 33 and the plurality of samples 34(1)-34(4). The signal 42 will be logic "1" (due to detection of the change of logic state for SSDATA in window 23) and the signal 46 will be logic "1" (due to detection of the change of logic state for SSDATA in window 33). The sample 24(1) will be logic "1" and the sample 34(1) will be logic "0". This is a "don't care" scenario with respect signal 52 and the operation of multiplexer 68. What is known in this case is that whichever of the samples that could be selected by the first multiplexer 68, the logic state of that sample may be incorrect, but the correct value for the sample is going to be the logical inverse of the previous value of the sample stored by the latch 96. The logic circuit 70 will output a logic "1" for signal 78 which is latched by latch 80. The second multiplexer 90 is then controlled to pass the logical inverse of the previous stored value through to latch 96 for output to the SIPO 100 for use as one bit of the N bit word for the output DATA 16.

With respect to scenario 4), this is detected using the first and second sampling circuits 22, 32 and the first and second comparator circuits 40, 44. If the samples 24 have the same first value, and the samples 34 have the same first value, then there was no logic state change during consecutive sampling windows. In this scenario, both of the signals 42 or 62 will be logic "0". In response to this condition, there is no change in the logic state of the control signal 52 and the multiplexer 68 will continue with selection of the correct value for output, and the logic circuit 70 will deassert the latched flag signal 82 at logic "0". In response, the multiplexer 90 will pass the selected correct sample to be latched by circuit 96 and supplied to the SIPO circuit 100 as the detected bit for use in generating one bit of the N bit data word for output DATA 16.

The scenario 4) case is illustrated in FIG. 4D with sampling window 23 and the plurality of samples 24(1)-24(4) and sampling window 33 and the plurality of samples 34(1)-34(4). The signal 42 will be logic "0" (due to detection of no change of logic state for SSDATA in window 23) and the signal 46 will be logic "0" (due to detection of no change of logic state for SSDATA in window 33). The sample 24(1) will be logic "1" and the sample 34(1) will be logic "1". Because there is no transition of signal 42 or signal 46 to logic "1", the latch 50 remains in the set or reset state it was previously in, with no change in the logic state of the data select signal 52. As a result, the first multiplexer 68 will select to pass one of sample 24(1) at logic "1" or sample 34(1) at logic "1" as the correct value to the second multiplexer 90. The logic circuit 70 will output a logic "0" for signal 78 which is latched by latch 80. The second multiplexer 90 is then controlled to pass the correct sample 34(1) at logic "1" to the SIPO circuit 100 for use as one bit of the N bit word for the output DATA 16.

A control circuit 110 receives the latched flag 82, a control signal 124, the first comparison output signal 42, the second comparison output signal 46, and the data select signal 52. In operation, the control circuit historically tracks the logic states of the flag 82, the data select signal 52 and the signals 42 and 46. By monitoring the current and previous logic states of these signals through the stored historical data, the control circuit 110 can detect an accumulated jitter condition of the transmit clock from the tracked locations of detected logic transitions in the serial data SSDATA.

For example, the historical data for the logic states of the flag 82, the data select signal 52 and the signals 42 and 46 may show: a transition of the serial data SSDATA within the first sampling window 23, followed by a transition of the serial data SSDATA between sampling windows 23 and 33, followed by a transition of the data SSDATA within the second sampling window 33, followed by a transition of the serial data SSDATA between sampling windows 33 and 23, followed by a transition of the serial data SSDATA within the first sampling window 23. In this scenario, the control circuit 110 will detect existence of jitter of the transmit clock due to the fact that a greater number of bits of the serial data SSDATA being received within a receive window defined by the clock CLKB. In this case of a detected jitter condition, the control circuit 110 must control the operation of the SIPO circuit 100 to output the N bit word for the output DATA 16 over a fewer number of cycles of the clock CLKB and adjust the recovered clock RX-CLK accordingly. The control circuit 110 asserts control signal 102 to cause a counter circuit 120 which is counting cycles of the clock CLKB to advance its count value by one. As a result, the SIPO circuit 100 will output the N bit word for the output DATA 16 over N−1 cycles of the clock CLKB by using N−1 bits output from the latch 96 and an Nth bit output from latch 64 or latch 66. The control signal 102 is asserted logic high in response to detection of the following operating condition: signal 52 transitions from logic "0" to logic "1" and flag 82 was logic "0" at the time of a last occurrence of signal 46 transitioning to logic "1".

Conversely, the historical data for the logic states of the flag 82, the data select signal 52 and the signals 42 and 46 may show: a transition of the serial data SSDATA within the first sampling window 23, followed by a transition of the serial data SSDATA between sampling windows 33 and 23, followed by a transition of the data SSDATA within the second sampling window 33, followed by a transition of the serial data SSDATA between sampling windows 23 and 33, followed by a transition of the serial data SSDATA within the first sampling window 23. In this scenario, the control circuit 110 will detect existence of jitter of the transmit clock and that a lesser number of bits are being received within a receive window defined by the clock CLKB. In this case of a detected jitter condition, the control circuit 110 must control the operation of the SIPO circuit 100 to output the N bit word for the output DATA 16 over a greater number of cycles of the clock CLK and adjust the recovered clock RX-CLK accordingly. The control circuit 110 asserts control signal 106 to cause a counter circuit 120 which is counting cycles of the clock CLKB to hold its count value for one clock cycle. As a result, the SIPO circuit 100 will output the N bit word for the output DATA 16 over N+1 cycles of the clock CLKB by using N bits output from the latch 96. The control signal 106 is asserted logic high in response to detection of the following operating condition: signal 52 transitions from logic "1" to logic "0" and flag 82 was logic "0" at the time of a last occurrence of signal 42 transitioning to logic "1".

The bit counter 120 generates a control signal 104 in response to the current count value. The signal 104 has a first logic state if the count value is less than N, and the SIPO circuit 100 responds to the first logic state of signal 104 by continuing to shift data bits output from latch 96 in response to clock CLKB to form the N bit data word for the DATA output 16. The signal 104 has a second logic state if the count value equals N, and the SIPO circuit 100 responds to the second logic state of signal 104 by outputting the N bit data word for the DATA output 16.

The control signal 102 is also received by the SIPO circuit 100. As noted above, the assertion of the control signal 102 is made in response to detection of the jitter condition. In this case, the bit counter 120 will advance its count by one and thus there will be only N−1 cycles of the clock CLKB for generating N bits of the DATA output 16. The assertion of the signal 102 informs the SIPO circuit 100 of this case, and the SIPO responds by ensuring that N bits have been shifted in to produce the DATA output 16 in response to the second logic state of the signal 104. In this case, the SIPO circuit 100 uses the last N−2 bits output from the latch 96 plus two additional bits (i.e., the Nth bit and N−1th bit) from latch 64 or latch 66 to produce the required N bits for the DATA output. In a corner case operating condition, where the signal 102 is asserted during the counting of the Nth bit, there is no room left in the data word for adding bits. So, the bit from latch 66 is used as the first bit in the next data word and the bit from latch 96 is used as the second bit of that data word.

The control signal 106 is also received by the SIPO circuit 100. As noted above, the assertion of the control signal 106 is made in response to detection of the jitter condition. In this case, the bit counter 120 will hold its count by one and thus there will be N+1 cycles of the clock CLKB for N bits of the DATA output 16. The assertion of the signal 106 informs the SIPO circuit 100 of this case, and the SIPO responds by ensuring that N bits have been shifted in from the latch 96 to produce the DATA output 16 in response to the second logic state of the signal 104.

Figure 3A:
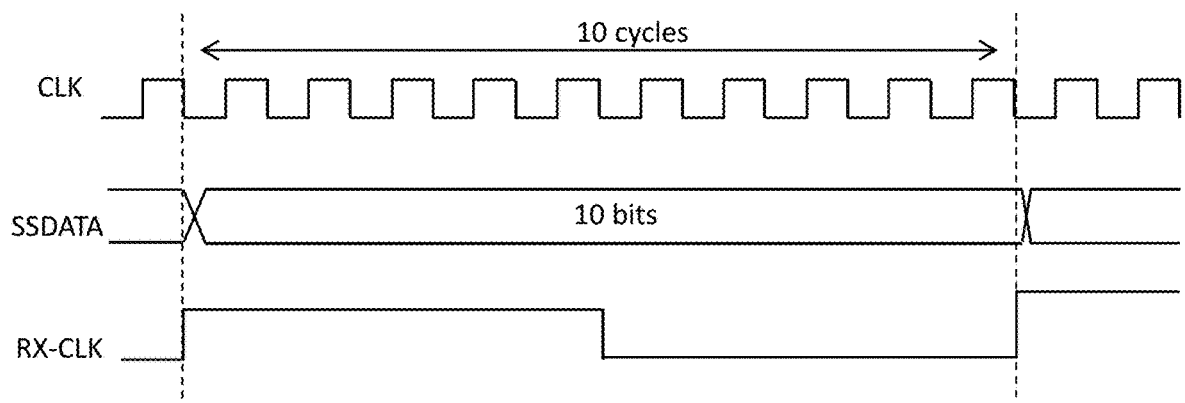
FIGS. 3A-3C are timing relationship diagrams for CDR circuit output.

FIG. 3A shows the relationship between the sampling clock CLK, the SIPO output of the recovered DATA and the recovered clock RX-CLK in a scenario where the detected accumulated jitter is within a certain limit. In this scenario, the control circuit 110 has determined from the historical data for the logic states of the flag 82, the data select signal 52 and the signals 42 and 46 that the jitter is within the acceptable tolerance. The control signals 102 and 106 are not asserted and the bit counter 120 counts N cycles of the clock CLKB to control the SIPO circuit 100 through signal 104 to collect N consecutive detected data bits from the data samples output by the latch 96 over N cycles of the clock CLKB to generate the N bit data word for the DATA output 16 and the control circuit 110 generates one clock cycle of the recovered clock RX-CLK 18.

Figure 3B:
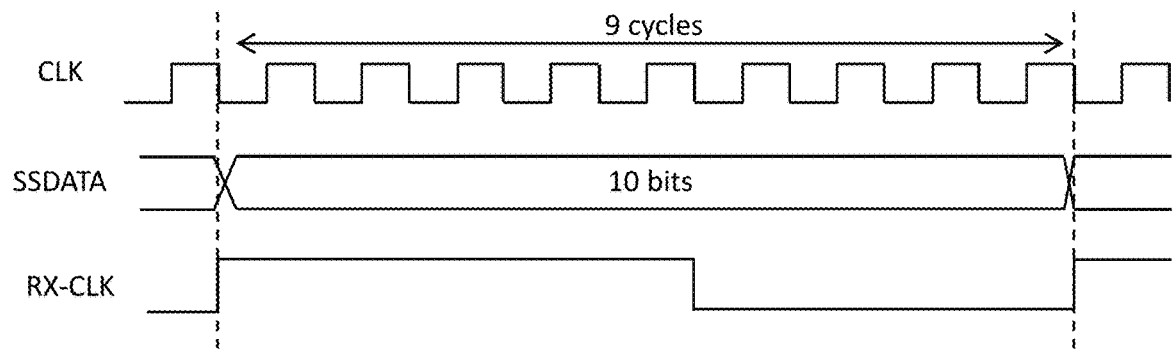

FIG. 3B shows the relationship between the sampling clock CLK, the SIPO output of the recovered DATA and the recovered clock RX-CLK in a scenario where the detected accumulated jitter exceeds the certain limit (due to the sampling clock having a frequency that is lower (i.e., higher period) than the transmit clock). In this scenario, the control circuit 110 has determined from the historical data for the logic states of the flag 82, the data select signal 52 and the signals 42 and 46 that the jitter is not within the acceptable tolerance (because the clock period is smaller than the ideal period). The control signal 102 is asserted (and control signal 106 is not asserted) and the value of the bit counter 120 is advanced by one. As a result, the bit counter 120 will count N−1 cycles of the clock CLKB to control the SIPO circuit 100 through signal 104 to collect N−1 data bits from the data samples output by the latch 96 and an Nth bit output from the latch 64 or latch 66 over N−1 cycles of the clock CLKB to generate the N bit data word for the DATA output 16 and one clock cycle of the recovered clock RX-CLK 18. It is important to note here that the data bit represented by the sample stored in the latch 64, 66 is needed to perform a bit stuffing providing the N-th bit of the data word, the first through N−1th bits being obtained from latch 96.

With respect to the previously noted corner case in the context of the FIG. 3B jitter scenario: the control circuit 110 receives a signal 124 from the bit counter 120 which indicates the current bit count. If the control signal 102 is asserted during the N-th bit of the SIPO circuit 100 operation to generate the data word (i.e., at the Nth count value), then there is not an option to perform bit stuffing in the current frame because the SIPO has already shifted in the required N bits from the latch 96. In this case, the extra data bit must be stuffed into the subsequent data word (i.e., the next frame) of the DATA output. The first bit of the next frame is then stuffed by the SIPO circuit 100 with the data value stored in the latch 66 and the second bit comes from latch 96.

Figure 3C:
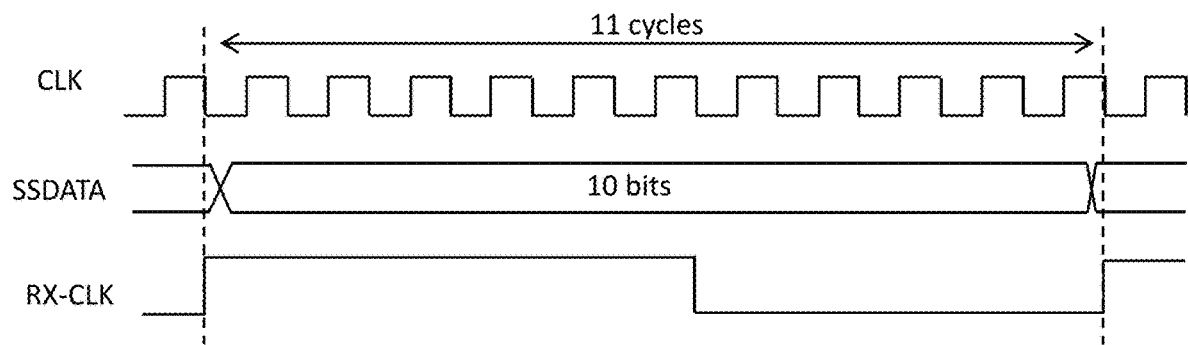

FIG. 3C shows the relationship between the sampling clock CLK, the SIPO output of the recovered DATA and the recovered clock RX-CLK in a scenario where the accumulated jitter exceeds the limit (due to the sampling clock having a frequency that is higher (lower period) than the transmit clock). In this scenario, the control circuit 110 has determined from the historical data for the logic states of the flag 82, the data select signal 52 and the signals 42 and 46 that the jitter is not within the acceptable tolerance (the clock period is greater than the ideal period). The control signal 106 is asserted (control signal 102 is not asserted) and the value of the bit counter 120 is held by one clock cycle. As a result, the bit counter 120 will count N+1 cycles of the clock CLKB to control the SIPO circuit 100 through signal 104 to collect N data bits from the data samples output by the latch 96 over N+1 cycles of the clock CLKB to generate the N bit data word for the DATA output 16 and one clock cycle of the recovered clock RX-CLK 18.

The control circuit 110 further generates the recovered clock signal RX-CLK 18 for further processing by the receiver circuit 10. The recovered clock signal RX-CLK 18 is generated as a function of the clock CLKB and the operation to trigger the SIPO circuit 100 to generate the N bit data word for the DATA output 16. There will be one cycle of the recovered clock signal RX-CLK 18 generated for each data word output as shown in FIGS. 3A-3C. The period of the recovered clock signal RX-CLK 18 is shrunk to N−1 cycles of the clock CLKB in response to assertion of signal 102 and is stretched to N+1 cycles of the clock CLKB in response to assertion of the signal 106.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. A circuit, comprising:
   a first sampling circuit configured to take a plurality of phase offset first samples of a received serial data stream in response to a first edge of a sampling clock;
   a second sampling circuit configured to take a plurality of phase offset second samples of the received serial data stream in response to a second edge of the sampling clock, wherein the second edge is opposite the first edge;
   a first comparator circuit configured to determine whether the plurality of phase offset first samples have a same logic state;
   a second comparator circuit configured to determine whether the plurality of phase offset second samples have a same logic state;
   a first selection circuit configured to select one of the first samples or one of the second samples in response to the determinations made by the first and second comparator circuits; and
   a serial to parallel converter circuit configured to generate an output word including the selected one of the first and second samples.

2. The circuit of claim 1, wherein the first selection circuit comprises:
   a first multiplexer having a first input configured to receive said one of the first samples and a second input configured to receive said one of the second samples; and
   a first control circuit configured to generate a first selection signal for controlling the first multiplexer in response to the determinations made by the first and second comparator circuits.

3. The circuit of claim 2, wherein the first control circuit comprises a set-reset latch circuit that is set in response to the determination made by the first comparator circuit to generate the first selection signal in a first logic state and reset in response to the determination made by the second comparator circuit to generate the first selection signal in a second logic state.

4. The circuit of claim 3, wherein the first selection signal in the first logic state causes the first multiplexer to select said one of the second samples for use by the serial to parallel converter circuit, and wherein the first selection signal in the second logic state causes the first multiplexer to select said one of the first samples for use by the serial to parallel converter circuit.

5. The circuit of claim 1, further comprising a second selection circuit configured to select the first selection circuit selected one of the first samples or one of the second samples or a logical inverse of a previously selected one of the first or second samples in response to the determinations made by the first and second comparator circuits.

6. The circuit of claim 5, wherein the second selection circuit comprises:
   a second multiplexer having a first input configured to receive said first selection circuit selected one of the first samples or one of the second samples and a second input configured to receive said logical inverse of the previously selected one of the first or second samples; and
   a second control circuit configured to generate a second selection signal for controlling the second multiplexer in response to the determinations made by the first and second comparator circuits.

7. The circuit of claim 6, wherein the second control circuit:
   generates the second control signal in a first logic state to cause the second multiplexer to select said logical inverse of the previously selected one of the first or second samples for use by the serial to parallel converter circuit in response to the first comparator circuit determining that the plurality of phase offset first samples do not have the same logic state and the second comparator circuits determining that the plurality of phase offset second samples do not have the same logic state; and
   otherwise generates the second control signal in a second logic state to cause the second multiplexer to select said first selection circuit selected one of the first samples or one of the second samples for use by the serial to parallel converter circuit.

8. The circuit of claim 6, wherein the second control circuit:
   generates the second control signal in a first logic state to cause the second multiplexer to select said logical inverse of the previously selected one of the first or second samples for use by the serial to parallel converter circuit in response to the first comparator circuit determining that the plurality of phase offset first samples have the same logic state and the second comparator circuit determining that the plurality of phase offset second samples have the same logic state and where the logic states of the plurality of phase offset first samples and plurality of phase offset second samples are different; and
   otherwise generates the second control signal in a second logic state to cause the second multiplexer to select said first selection circuit selected one of the first samples or one of the second samples for use by the serial to parallel converter circuit.

9. The circuit of claim 1, further comprising a jitter detection circuit configured to detect a jitter condition relative to the sampling clock and select a number of clock cycles of the sampling clock for each output word generated by the serial to parallel converter circuit.

10. The circuit of claim 9, wherein the jitter detection circuit monitors the determinations made by the first and second comparator circuits to detect instances of detected logic transition of the received serial data stream over time in order to detect a jitter condition and in response thereto controls the serial to parallel converter circuit to generate an N-bit output word from N selected ones of the first and second samples over a time period having N+1 cycles of the sampling clock.

11. The circuit of claim 9, wherein the jitter detection circuit monitors the determinations made by the first and second comparator circuits to detect instances of detected logic transition of the received serial data stream over time in order to detect a jitter condition and in response thereto controls the serial to parallel converter circuit to generate an N-bit output word from at least selected ones of the first and second samples over a time period having N−1 cycles of the sampling clock.

12. The circuit of claim 11, further comprising a shift register storing a plurality of second samples of the received serial data stream, and wherein the N-bit output word generated by the serial to parallel converter circuit includes less than N selected ones of the first and second samples and one or more of the second samples from the shift register.

13. The circuit of claim 9, wherein the jitter detection circuit monitors the determinations made by the first and second comparator circuits to detect instances of detected logic transition of the received serial data stream over time in order to detect a no jitter condition and in response thereto controls the serial to parallel converter circuit to generate an N-bit output word from N selected ones of the first and second samples over a time period having N cycles of the sampling clock.

14. The circuit of claim 1, wherein the output word is generated by the serial to parallel converter circuit over a plurality of cycles of the sampling clock and further comprising a control circuit configured to output a recovered clock signal having a period equal to said plurality of cycles of the sampling clock.

15. A method, comprising:
sampling a received serial data stream in response to a first edge of a sampling clock to obtain a plurality of phase offset first samples;
sampling the received serial data stream in response to a second edge of the sampling clock, wherein the second edge is opposite the first edge, to obtain a plurality of phase offset second samples;
determining whether the plurality of phase offset first samples have a same logic state;
determining whether the plurality of phase offset second samples have a same logic state;
first selecting one of the first samples or one of the second samples in response to results of the determining steps; and
including the selected one of the first and second samples for a serial to parallel conversion to generate an output word.

16. The method of claim 15, wherein first selecting comprises:
selecting said one of the second samples for serial to parallel conversion in response to a determination that the plurality of phase offset first samples do not have a same logic state; and
selecting said one of the first samples for serial to parallel conversion in response to a determination that the plurality of phase offset second samples do not have a same logic state.

17. The method of claim 15, further comprising:
second selecting the first selecting one of the first samples or one of the second samples or a logical inverse of a previously selected one of the first or second samples in response to results of the determining steps.

18. The method of claim 17, wherein second selecting comprises:
selecting said logical inverse of the previously selected one of the first or second samples for serial to parallel conversion in response to a determination that the plurality of phase offset first samples do not have the same logic state and the plurality of phase offset second samples do not have the same logic state; and
otherwise selecting said first selecting one of the first samples or one of the second samples for serial to parallel conversion.

19. The method of claim 17, wherein second selecting comprises:
selecting said logical inverse of the previously selected one of the first or second samples for serial to parallel conversion in response to a determination that the plurality of phase offset first samples have the same logic state and the plurality of phase offset second samples have the same logic state and where the logic states of the plurality of phase offset first samples and plurality of phase offset second samples are different; and
otherwise selecting said first selecting one of the first samples or one of the second samples for serial to parallel conversion.

20. The method of claim 15, further comprising:
detecting a jitter condition relative to the sampling clock; and
in response the detected jitter condition, selecting a number of clock cycles of the sampling clock for each output word generated by the serial to parallel conversion.

21. The method of claim 20, wherein detecting the jitter condition comprises:
monitoring the plurality of phase offset first samples and plurality of phase offset second samples to detect instances of detected logic transition of the received serial data stream over time that indicate an unacceptable level of jitter is present; and
in response thereto, controlling the serial to parallel conversion to generate an N-bit output word from N selected ones of the first and second samples over a time period having N+1 cycles of the sampling clock.

22. The method of claim 20, wherein detecting the jitter condition comprises:
monitoring the plurality of phase offset first samples and plurality of phase offset second samples to detect instances of detected logic transition of the received serial data stream over time that indicate an unacceptable level of jitter is present; and
in response thereto, controlling the serial to parallel conversion to generate an N-bit output word from selected ones of the first and second samples over a time period having N−1 cycles of the sampling clock.

23. The method of claim 22, wherein the N-bit output word generated by the serial to parallel conversion includes less than N selected ones of the first and second samples and one or more of the second samples.

24. The method of claim 20, wherein detecting the jitter condition comprises:
monitoring the plurality of phase offset first samples and plurality of phase offset second samples to detect instances of detected logic transition of the received serial data stream over time that indicate an acceptable level of jitter is present; and
controlling the serial to parallel conversion to generate an N-bit output word from N selected ones of the first and second samples over a time period having N cycles of the sampling clock.

25. The method of claim 15, wherein serial to parallel conversion generates the output word over a plurality of cycles of the sampling clock and further comprising generating a recovered clock signal having a period equal to said plurality of cycles of the sampling clock.

* * * * *